(12) United States Patent
Huang et al.

(10) Patent No.: US 9,814,133 B2
(45) Date of Patent: Nov. 7, 2017

(54) TOUCH PANEL MODULE AND ELECTROSTATIC DISCHARGING METHOD

(71) Applicant: Novatek Microelectronics Corp., Hsinchu (TW)

(72) Inventors: He-Wei Huang, Hsinchu (TW); Chih-Chang Lai, Taichung (TW); Wing-Kai Tang, Hsinchu (TW); Ching-Yang Pai, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 119 days.

(21) Appl. No.: 14/669,006

(22) Filed: Mar. 26, 2015

(65) Prior Publication Data

US 2015/0309625 A1    Oct. 29, 2015

Related U.S. Application Data

(60) Provisional application No. 61/985,441, filed on Apr. 28, 2014.

(30) Foreign Application Priority Data

Sep. 24, 2014 (TW) ............... 103133006 A

(51) Int. Cl.
  *G06F 3/041* (2006.01)
  *H05K 1/02* (2006.01)
  *G06F 3/044* (2006.01)

(52) U.S. Cl.
  CPC ........... *H05K 1/0259* (2013.01); *G06F 3/044* (2013.01); *G06F 3/0418* (2013.01); *H05K 2201/09781* (2013.01); *H05K 2201/10128* (2013.01)

(58) Field of Classification Search
  CPC ....................................................... G06F 3/045
  (Continued)

(56) References Cited

U.S. PATENT DOCUMENTS 9,513,670 B2    12/2016  Chen et al.
2011/0228431 A1*   9/2011  Chen .................... H05K 1/0259
                                                      361/56

(Continued)

FOREIGN PATENT DOCUMENTS

CN    101788875    7/2010
CN    102541167    7/2012
(Continued)

OTHER PUBLICATIONS

"Office Action of Taiwan Counterpart Application", dated Dec. 15, 2015, p. 1-p. 12.

(Continued)

*Primary Examiner* — Long D Pham
(74) *Attorney, Agent, or Firm* — JCIPRNET

(57) ABSTRACT

A touch panel module including a touch panel and an electrostatic discharge (ESD) protection circuit is provided. The touch panel includes one or more conductive electrodes and one or more dummy electrodes. The one or more conductive electrodes include at least one of one or more driving electrodes and one or more sensing electrodes. The one or more dummy electrodes are configured to fill areas between the one or more conductive electrodes or areas outside the one or more conductive electrodes. The ESD protection circuit is electrically connected to at least one dummy electrode of the one or more dummy electrodes, and configured to provide an electrostatic discharging path to the at least one dummy electrode. Furthermore, an electrostatic discharging method of the touch panel module is also provided.

14 Claims, 12 Drawing Sheets

(58) Field of Classification Search
USPC .......................................................... 345/173
See application file for complete search history.

(56) References Cited

U.S. PATENT DOCUMENTS

| | | |
|---|---|---|
| 2012/0062511 A1 | 3/2012 | Ishizaki et al. |
| 2012/0162849 A1* | 6/2012 | Tang .................... G06F 3/0416 361/220 |
| 2014/0028616 A1* | 1/2014 | Furutani ................. G06F 3/044 345/174 |
| 2014/0055412 A1 | 2/2014 | Teramoto |
| 2014/0176465 A1 | 6/2014 | Ma et al. |
| 2014/0210768 A1* | 7/2014 | Badaye .................. G06F 3/044 345/174 |
| 2014/0362306 A1* | 12/2014 | Chen .................... G06F 1/1656 349/12 |

FOREIGN PATENT DOCUMENTS

| | | |
|---|---|---|
| CN | 103293785 | 9/2013 |
| CN | 103488333 | 1/2014 |
| CN | 103631046 | 3/2014 |
| TW | 201222357 | 6/2012 |
| TW | 201232367 | 8/2012 |

OTHER PUBLICATIONS

"Office Action of China Counterpart Application", issued on Aug. 2, 2017, p1-p10, in which the listed references were cited.

\* cited by examiner

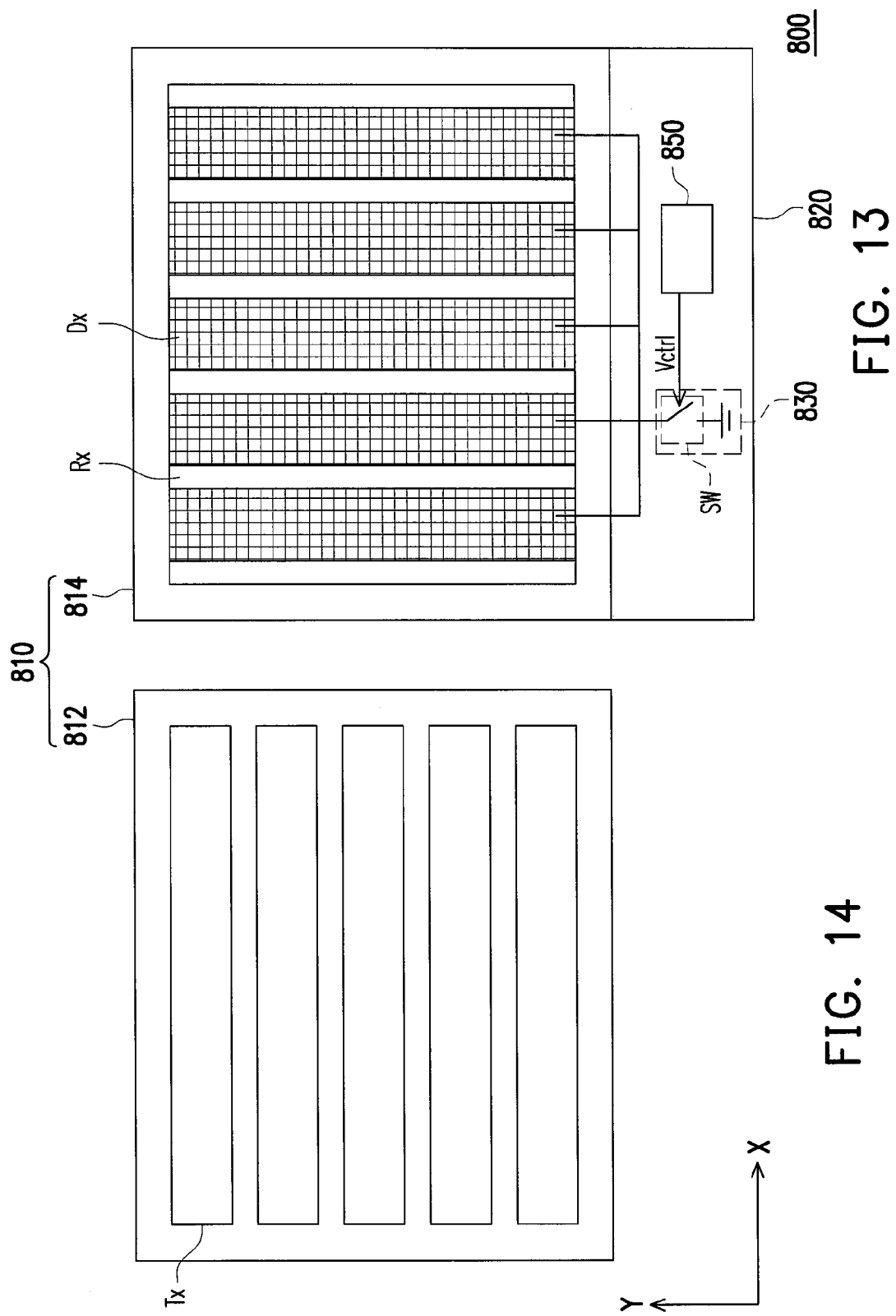

TOUCH PANEL MODULE AND ELECTROSTATIC DISCHARGING METHOD

CROSS-REFERENCE TO RELATED APPLICATION

This application claims the priority benefits of U.S. provisional application Ser. No. 61/985,441, filed on Apr. 28, 2014 and Taiwan application serial no. 103133006, filed on Sep. 24, 2014. The entirety of each of the above-mentioned patent applications is hereby incorporated by reference herein and made a part of this specification.

BACKGROUND OF THE INVENTION

Field of the Invention

The invention relates to a panel module and an electrostatic discharging method thereof, and more particularly, relates to a touch panel module and an electrostatic discharging method thereof.

Description of Related Art

Generally, a touch display panel includes a combination of a display panel and a touch panel. Based on different integration methods of the touch panel and the display panel, a touch display module may be classified into an out-cell touch display module and an embedded touch display module. Based on different disposition positions of the touch panel with respect to the display panel, the embedded touch display module may be further classified into an in-cell touch display module and an on-cell touch display module. In order to improve a display quality, dummy electrodes are usually disposed on the touch panel in the conventional art, so as to compensate an optical visibility. However, the dummy electrodes on the touch panel often accumulate electrostatic charges, and the accumulated electrostatic charges may seriously affect the display quality of the display panel.

SUMMARY OF THE INVENTION

The invention is directed to a touch panel module and an electrostatic discharging method thereof, which are capable of appropriately discharging the accumulated electrostatic charges of the touch panel in order to prevent the display quality of the touch panel from being affected.

The touch panel module of the invention includes a touch panel and an electrostatic discharge protection circuit. The touch panel includes one or more conductive electrodes and one or more dummy electrodes. The one or more conductive electrodes include at least one of one or more driving electrodes and one or more sensing electrodes. The one or more dummy electrodes are configured to fill areas between the one or more conductive electrodes or areas outside the one or more conductive electrodes. The electrostatic discharge protection circuit is electrically connected to at least one dummy electrode of the one or more dummy electrodes, and configured to provide an electrostatic discharging path to the at least one dummy electrode.

In an embodiment of the invention, the one or more conductive electrodes are disposed in an active area of the touch panel. The touch panel further includes one or more routings, which are disposed in a routing area of the touch panel and connected to the one or more conductive electrodes. The one or more dummy electrodes are disposed in at least one of the routing area and the active area.

In an embodiment of the invention, the one or more dummy electrodes include one or more first dummy electrodes and one or more second dummy electrodes. The one or more first dummy electrodes are disposed in the active area and electrically connected to one another. The one or more second dummy electrodes are disposed in the routing area and electrically connected to one another. The one or more first dummy electrodes and the one or more second dummy electrodes are electrically connected to each other and electrically connected to the electrostatic discharge protection circuit.

In an embodiment of the invention, the touch panel is a single-layer multi-touch touch panel.

In an embodiment of the invention, the one or more conductive electrodes include the one or more sensing electrodes. The one or more dummy electrodes are configured to fill areas between the one or more sensing electrodes. The one or more dummy electrodes are electrically connected to one another, and electrically connected to the electrostatic discharge protection circuit.

In an embodiment of the invention, the touch panel is a double-layer touch panel.

In an embodiment of the invention, the electrostatic discharge protection circuit includes a passive circuit.

In an embodiment of the invention, the passive circuit is coupled between the at least one dummy electrode and a reference voltage.

In an embodiment of the invention, the electrostatic discharge protection circuit includes an active circuit.

In an embodiment of the invention, the active circuit is implemented by at least one switch.

In an embodiment of the invention, the electrostatic discharge protection circuit is intermittently turned on.

In an embodiment of the invention, the electrostatic discharge protection circuit provides the electrostatic discharging path within at least a part of time during a non-sensing period of the touch panel.

In an embodiment of the invention, the touch panel module further includes a control circuit, configured to control the active circuit to be turned on and off.

In an embodiment of the invention, the touch panel module further includes a flexible printed circuit board, which is connected to the touch panel. The electrostatic discharge protection circuit is disposed on the flexible printed circuit board.

In an embodiment of the invention, the touch panel module further includes a touch control integrated circuit, which is configured to control operations of the touch panel module. The electrostatic discharge protection circuit is disposed inside the touch control integrated circuit.

In an embodiment of the invention, the electrostatic discharge protection circuit is turned on when a potential difference between two ends of the electrostatic discharge protection circuit is greater than a voltage threshold, so as to provide the electrostatic discharging path.

In an embodiment of the invention, the electrostatic discharge protection circuit includes one or more wires electrically connected to at least one dummy electrode of the one or more dummy electrodes.

In an embodiment of the invention, the one or more dummy electrodes are electrically connected to one another, and further electrically connected to the electrostatic discharge protection circuit.

The touch panel module of the invention includes a touch panel. The touch panel includes one or more conductive electrodes and one or more dummy electrodes. The one or more conductive electrodes include at least one of one or more driving electrodes and one or more sensing electrodes. The one or more dummy electrodes are configured to fill areas between the one or more conductive electrodes or areas outside the one or more conductive electrodes. The electrostatic discharging method of the invention includes the following steps. An electrostatic discharging path is provided to at least one dummy electrode of the one or more dummy electrodes. Accumulated electrostatic charges of the at least one dummy electrode is discharged through the electrostatic discharging path within at least a part of time during a non-sensing period of the touch panel.

In an embodiment of the invention, the electrostatic discharging method of the invention further includes cutting off the electrostatic discharging path within at least a part of time during a sensing period of the touch panel.

Based on the above, in the exemplary embodiments of the invention, the electrostatic discharge protection circuit of the touch panel module is configured to provide an electrostatic discharge path for appropriately discharging the accumulated electrostatic charges of the touch panel in order to improve the display quality of the display panel.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 13 and FIG. 14 are schematic diagrams illustrating a touch panel module according to another exemplary embodiment of the invention.

DESCRIPTION OF THE EMBODIMENTS

Figure 1:
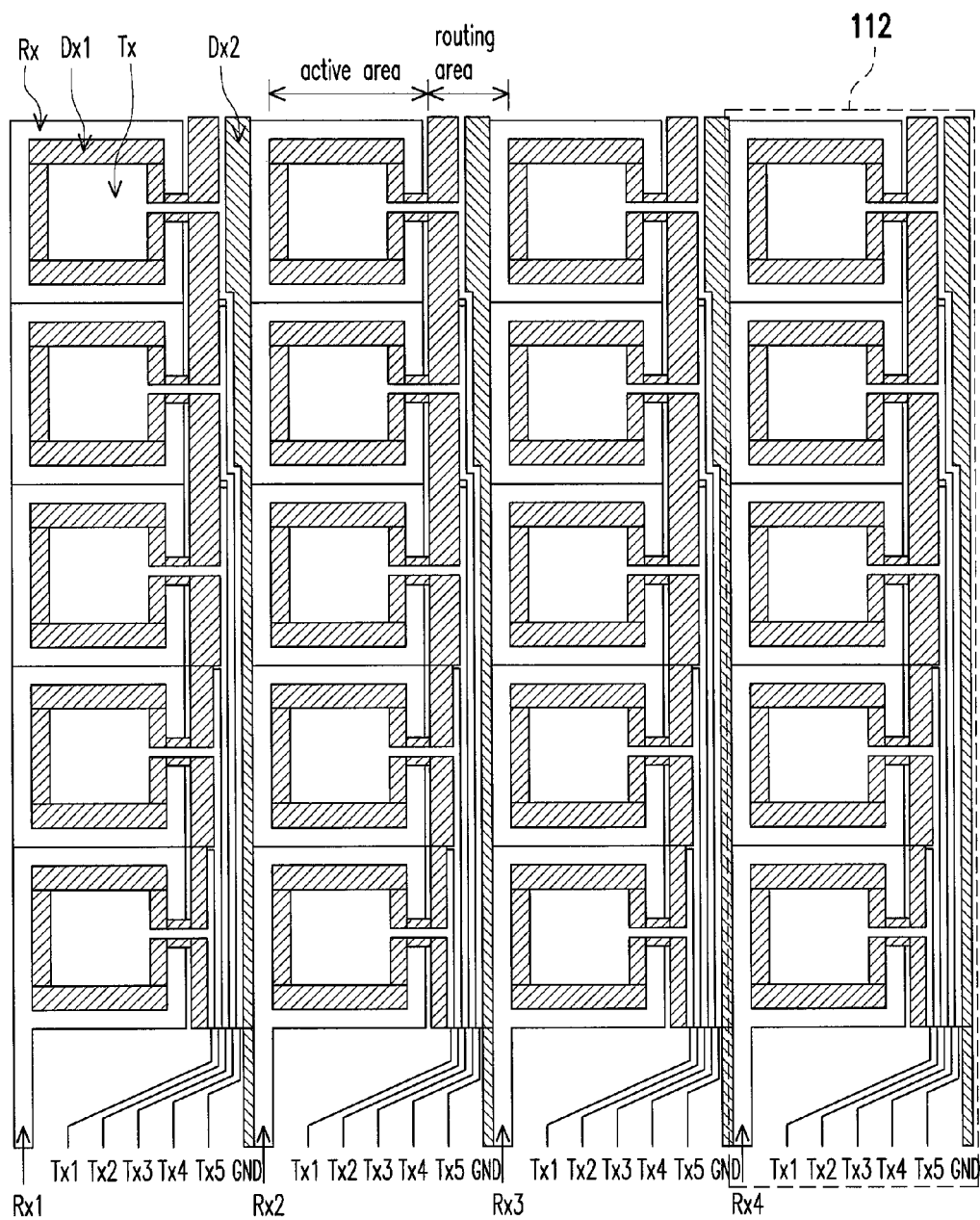
FIG. 1 is a schematic diagram illustrating a touch panel according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

The term "coupling/coupled" used in this specification (including claims) of the present disclosure may refer to any direct or indirect connection means. For example, "a first device is coupled to a second device" should be interpreted as "the first device is directly connected to the second device" or "the first device is indirectly connected to the second device through other devices or connection means."

In the exemplary embodiments of the invention, an electrostatic discharging method is provided for appropriately discharging electrostatic charges remained on a touch panel module in order to improve the display quality of the display panel. Generally, based on different integration methods of the touch panel and the display panel, a touch display module may be classified into an out-cell touch display module and an embedded touch display module. Based on different disposition positions of the touch panel on the display panel, the embedded touch display module may be further classified into an in-cell touch display module and an on-cell touch display module. In addition, the touch panel module according to the exemplary embodiments of the invention includes but not limited to a single-layer multi-touch touch panel or a double-layer touch panel. In other words, the exemplary embodiments of the invention is not intended to limit forms of the touch panel and the touch display module using the electrostatic discharging method, nor intended to limit disposition patterns of touch electrodes. Embodiments are provided below to describe the invention in detail, though the invention is not limited to the provided embodiments, and the provided embodiments can be suitably combined.

Figure 2:
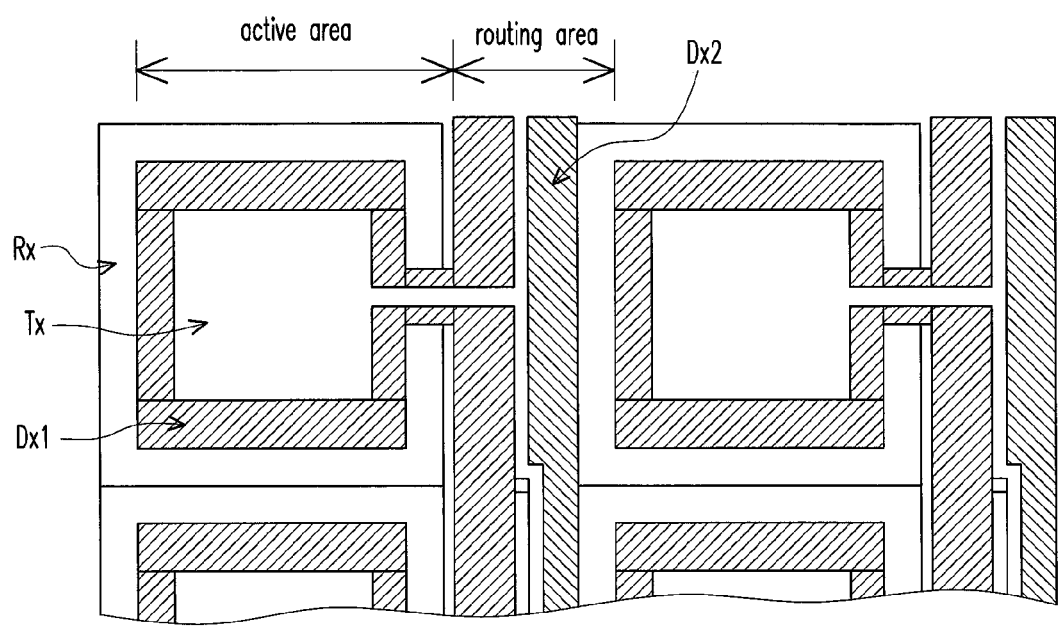
FIG. 2 is an enlarged schematic diagram illustrating a partial area of the touch panel in the exemplary embodiment of FIG. 1.

FIG. 1 is a schematic diagram illustrating a touch panel according to an exemplary embodiment of the invention. FIG. 2 is an enlarged schematic diagram illustrating a partial area of the touch panel in the exemplary embodiment of FIG. 1. Referring to FIG. 1 and FIG. 2, a touch panel 110 of the present embodiment includes one or more driving electrodes Tx, one or more sensing electrodes Rx, one or more dummy electrodes Dx1 and Dx2, and one or more routings Rx1 to Rx4 and Tx1 to Tx4. In the present exemplary embodiment, the driving electrodes Tx and the sensing electrodes Rx are disposed in an active area of the touch panel 110. The driving electrodes Tx and the sensing electrodes Rx serve as conductive electrodes which are under control of a touch control integrated circuit (not illustrated) and configured to sense touch gestures on the touch panel 110.

In the present exemplary embodiment, the routings Rx1 to Rx4 and Tx1 to Tx4 are disposed in a routing area of the touch panel, and electrically connected to the driving electrodes Tx and the sensing electrodes Rx. For instance, the routings Tx1 to Tx4 are electrically connected to the driving electrodes Tx, and configured to receive driving signals provided by the touch control integrated circuit and transmit the driving signals to the driving electrodes Tx. The routings Rx1 to Rx4 are electrically connected to the sensing electrodes Rx, and configured to transmit sensing signals generated by the sensing electrodes Rx and related to the touch gestures to the touch control integrated circuit.

In the present exemplary embodiment, the dummy electrodes Dx1 and Dx2 are configured to fill areas between the driving electrodes Tx and the sensing electrodes Rx or areas outside the driving electrodes Tx and the sensing electrodes Rx. For instance, the dummy electrodes Dx1 and Dx2 include one or more first dummy electrodes Dx1 and one or more second dummy electrodes Dx2. The first dummy electrodes Dx1 are disposed in the active area of the touch panel 110 and electrically connected to one another. The first dummy electrodes Dx1 in the active area are configured to fill the areas between the driving electrodes Tx and the sensing electrodes Rx. The second dummy electrodes Dx2 are disposed in the routing area of the touch panel 110 and electrically connected to one another. The second dummy electrodes Dx2 in the routing area are configured to fill the areas outside the driving electrodes Tx and the sensing electrodes Rx. In FIG. 1, the areas outside the driving electrodes Tx and the sensing electrodes Rx at least include the routing area of the touch panel 110. In the present exemplary embodiment, the second dummy electrodes Dx2 are electrically connected to an electrostatic discharge protection circuit (not illustrated) and configured to provide an electrostatic discharging path to the second dummy electrodes Dx2, so as to discharge the electrostatic charges remained on the display panel 110 in order to prevent the display quality of the display panel from being affected. In another embodiment, the first dummy electrodes Dx1 and the second dummy electrodes Dx2 may also be electrically connected to each other and electrically connected to the electrostatic discharge protection circuit, so as to collaboratively provide the electrostatic discharging path.

From another perspective, the touch panel 110 includes a plurality of independent touch pads 112, and each of the touch pads 112 includes the active area and the routing area. The active area includes a driving area, a receiving area and a dummy area, which are configured to dispose the driving electrodes Tx, the sensing electrodes Rx and the first dummy electrodes Dx1 respectively. Generally, the driving electrodes Tx and the sensing electrodes Rx disposed in aforesaid manner may be spaced apart by a specific distance. In order to at least compensate the optical visibility, the first dummy electrode Dx1 are disposed between the driving electrodes Tx and the sensing electrodes RX in the active area, so as to improve the display quality of the display panel. In the present exemplary embodiment, the first dummy electrodes Dx1 are also disposed between the routings Tx1 to Tx4 in the routing area in order to compensate the optical visibility. The second dummy electrodes Dx2 are also disposed between the routings Tx1 to Tx4 and the routings Rx1 to Rx4 at the adjacent touch pads 112, so as to compensate the optical visibility.

Figure 3:
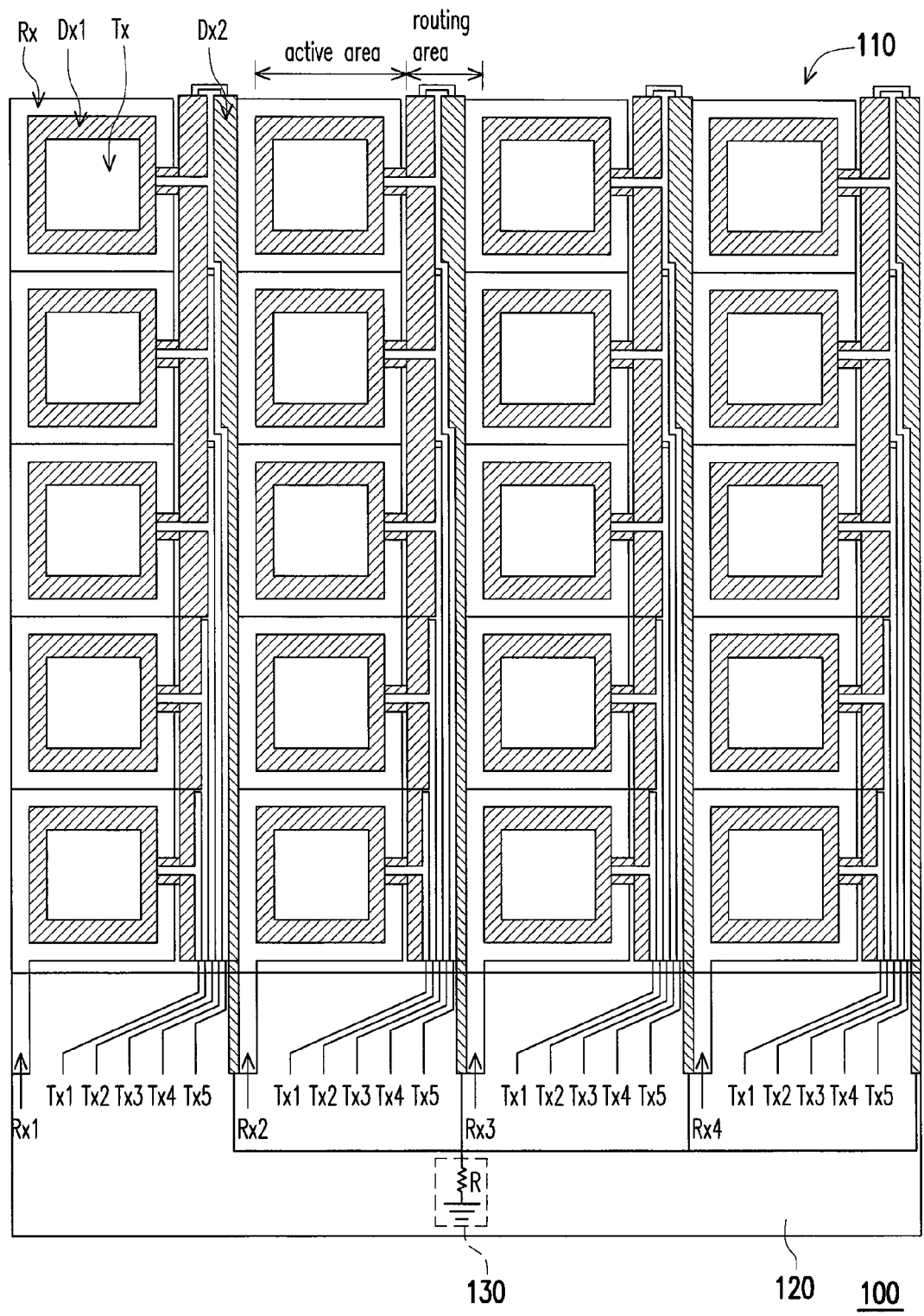
FIG. 3 is a schematic diagram illustrating a touch panel module according to an exemplary embodiment of the invention.

FIG. 3 is a schematic diagram illustrating a touch panel module according to an exemplary embodiment of the invention. Referring to FIG. 3, a touch panel module 100 of the present exemplary embodiment includes the touch panel 110, a flexible printed circuit board 120 and an electrostatic discharge protection circuit 130. The touch panel 110 and the flexible printed circuit board 120 are two different elements. The touch panel 110 belongs to the sensing area, and is configured to sense the touch gestures. The flexible printed circuit board 120 belongs to a non-sensing area, and is configured to connect to a touch control integrated circuit (not illustrated) or allow the touch control integrated circuit to be directly disposed thereon. In the present exemplary embodiment, the flexible printed circuit board 120 is electrically connected to the touch panel 110, and the electrostatic discharge protection circuit 130 is disposed on the flexible printed circuit board 120. In another embodiment, the electrostatic discharge protection circuit 130 may also be disposed in the touch control integrated circuit, which is not particularly limited in the invention. In the present exemplary embodiment, the first dummy electrodes Dx1 and the second dummy electrodes Dx2 are electrically connected to each other and electrically connected to the electrostatic discharge protection circuit 130. The electrostatic discharge protection circuit 130 is, for example, electrically connected to the second dummy electrodes Dx2, and configured to provide an electrostatic discharging path to the first dummy electrodes Dx1 and the second dummy electrodes Dx2.

In the present exemplary embodiment, the electrostatic discharge protection circuit 130 includes, for example, a passive circuit. The passive circuit includes a resistor R, which is coupled between the second dummy electrodes Dx2 and a reference voltage. In this example, the reference voltage may be, for example, a grounding voltage that can be practically implemented by connecting the resistor R to the ground as shown in FIG. 3. Therefore, in the present exemplary embodiment, the first dummy electrodes Dx1 and the second dummy electrodes Dx2 are electrically connected to each other, and connected to the ground through the resistor R, so as to discharge the electrostatic charges remained on the display panel 110 in order to improve the display quality of the display panel.

In another exemplary embodiment, the electrostatic discharge protection circuit 130 includes, for example, one or more wires which are electrically connected to the second dummy electrodes Dx2. In this example, the one or more wires are, for example, directly coupled to the ground to provide the electrostatic discharging path, and thus the resistor R is not disposed in such electrostatic discharging path.

FIG. 1 to FIG. 3 illustrate a disposition pattern of touch electrodes on the touch panel and an implementation of the electrostatic discharge protection circuit. However, the electrostatic discharging method of the invention is not limited to be applicable only to the touch panel module as depicted in FIG. 1 to FIG. 3.

Figure 4:
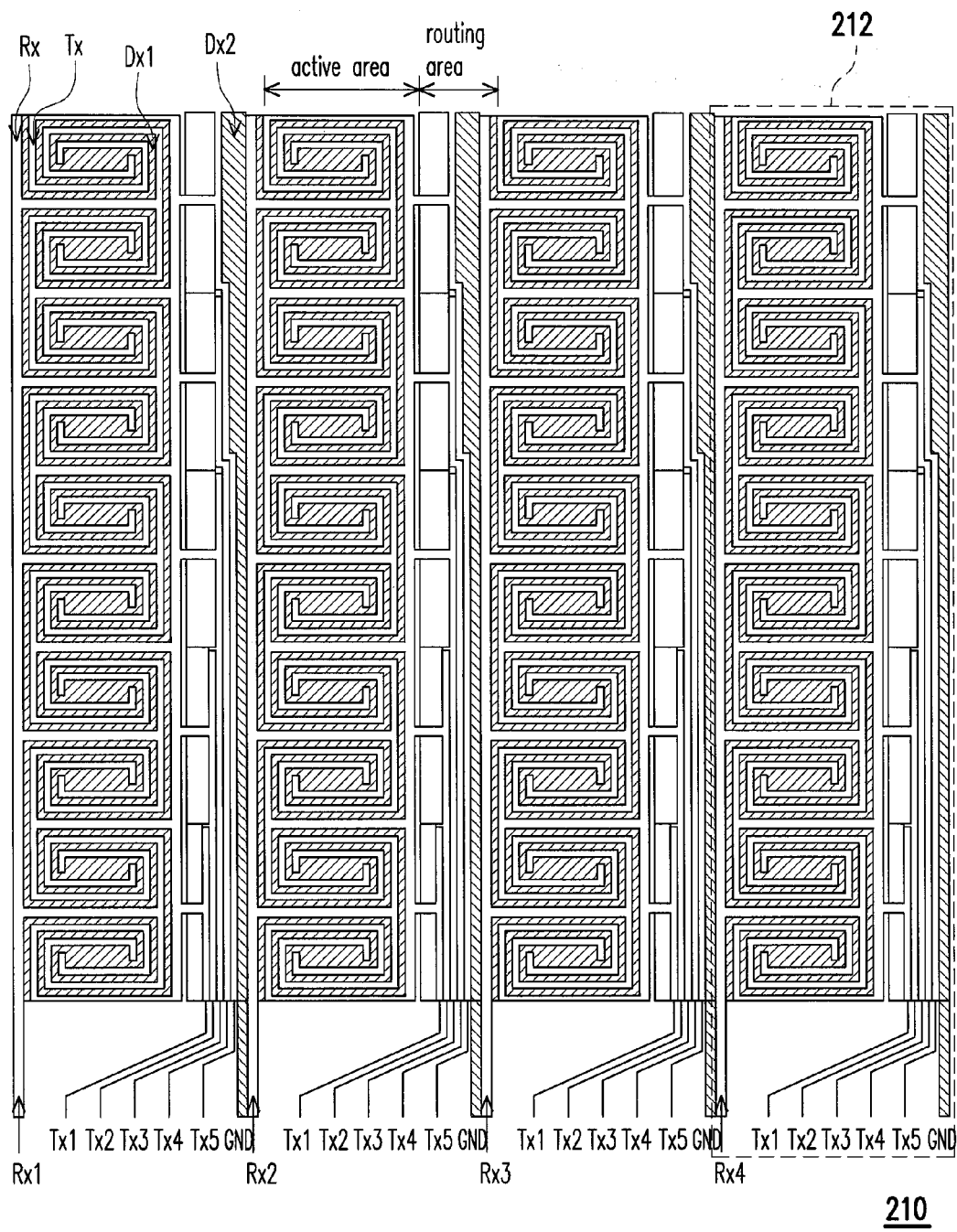
FIG. 4 is a schematic diagram illustrating a touch panel according to another exemplary embodiment of the invention.
Figure 5:
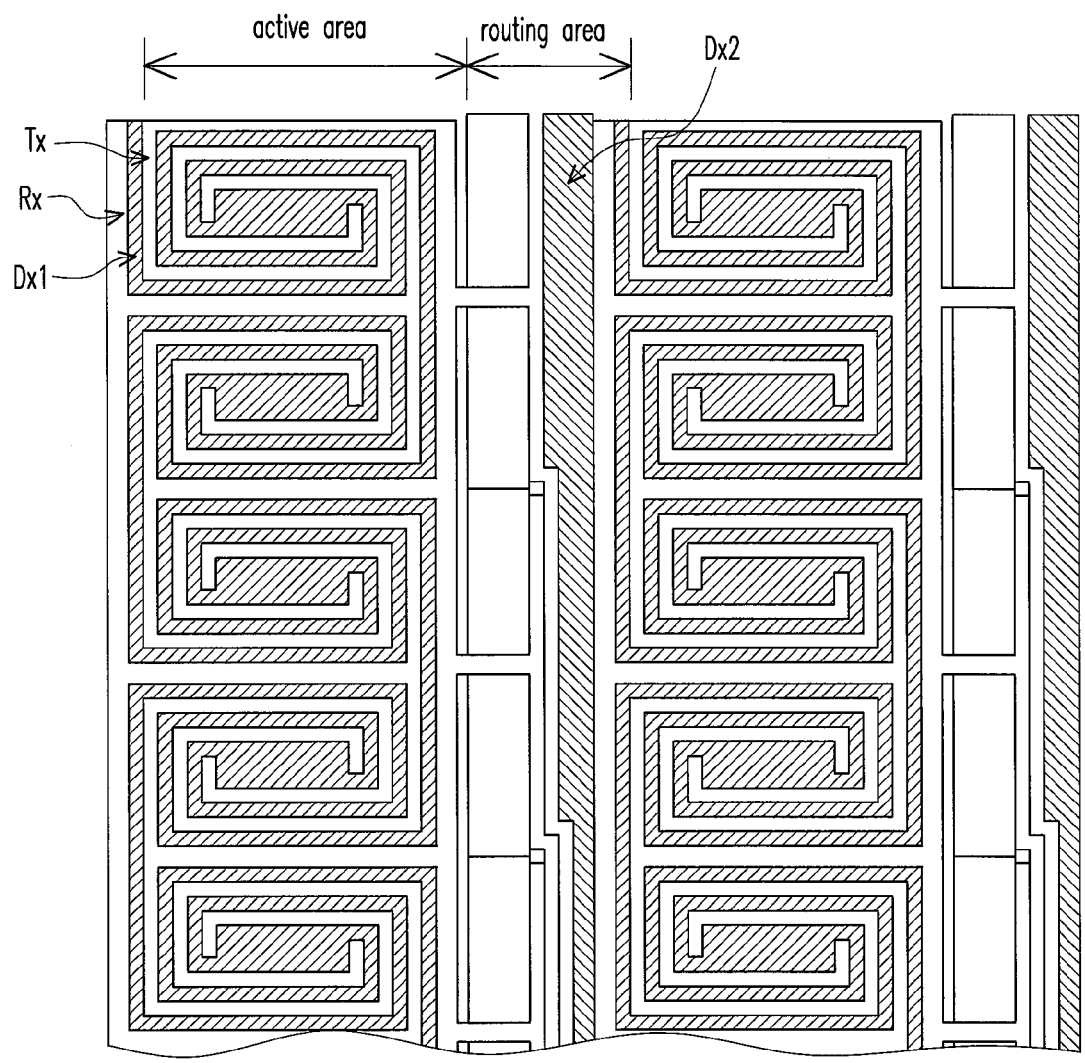
FIG. 5 is an enlarged schematic diagram illustrating a partial area of the touch panel in the exemplary embodiment of FIG. 4.
Figure 6:
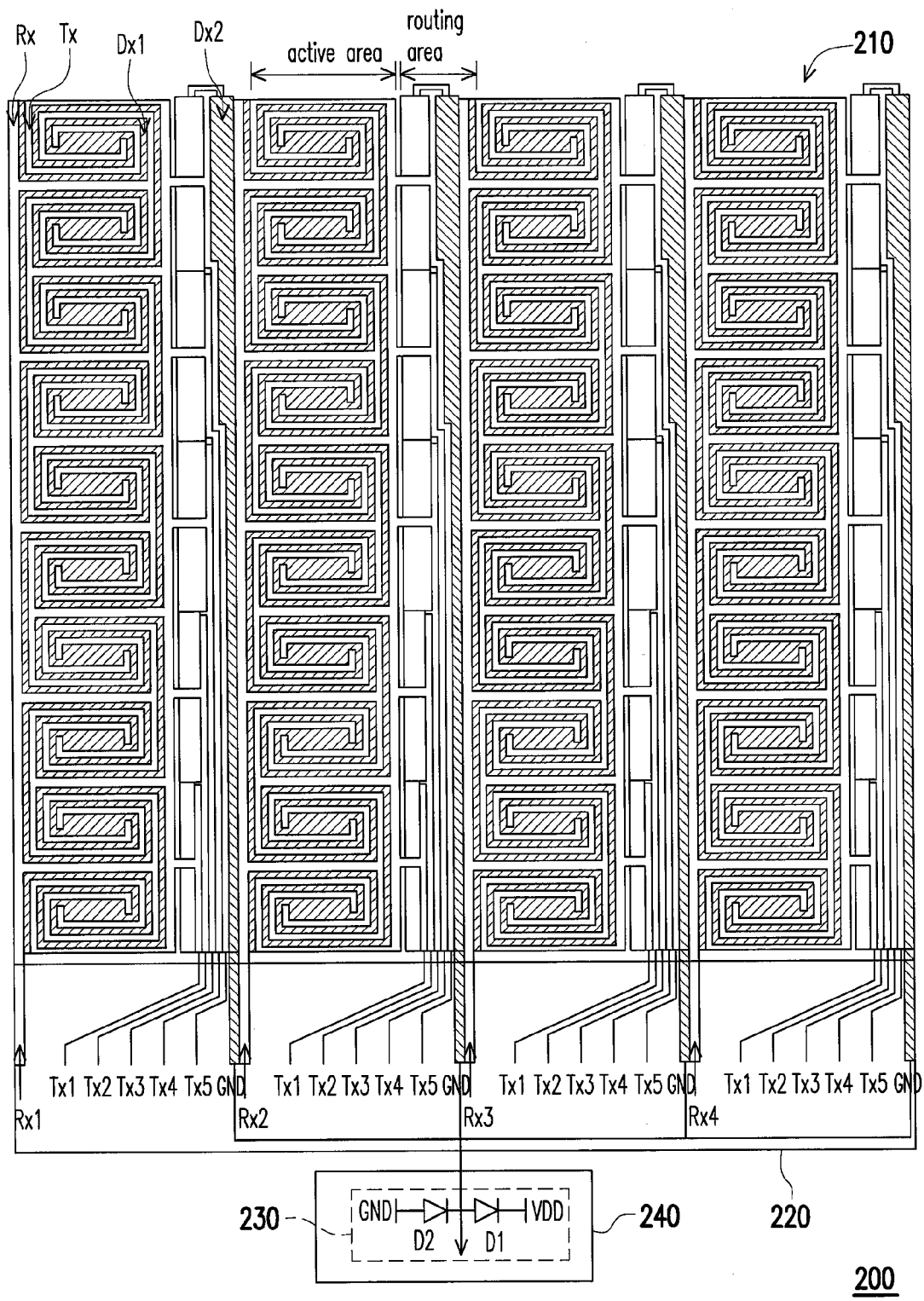
FIG. 6 is a schematic diagram illustrating a touch panel module according to another exemplary embodiment of the invention.

FIG. 4 is a schematic diagram illustrating a touch panel according to another exemplary embodiment of the invention. FIG. 5 is an enlarged schematic diagram illustrating a partial area of the touch panel in the exemplary embodiment of FIG. 4. FIG. 6 is a schematic diagram illustrating a touch panel module according to another exemplary embodiment of the invention. Referring to FIG. 4 to FIG. 6, a touch panel module 200 of the present exemplary embodiment is similar to the touch panel module 100 of FIG. 3, and major differences between the two include, for example, a touch control integrated circuit 240 that is further included in the touch panel module 200, a disposition pattern of touch electrodes, and an implementation of the electrostatic discharge protection circuit.

Specifically, in the present exemplary embodiment, the driving electrodes Tx and the sensing electrodes Rx are windingly disposed in a manner of spiral form, and the first dummy electrodes Dx1 are disposed between the driving electrodes Tx and the sensing electrodes Rx, so as to compensate the optical visibility. The first dummy electrodes Dx1 and the second dummy electrodes Dx2 are electrically connected to each other and electrically connected to an electrostatic discharge protection circuit 230. In this example, the first dummy electrodes Dx1 and the second dummy electrodes Dx2 may also be electrically connected to an input/output pin of the touch control integrated circuit 240 to serve as the electrostatic discharging path.

In the present exemplary embodiment, the touch panel module 200 further includes the touch control integrated circuit 240, which is configured to control operations of the touch panel module 200. In this example, the touch control integrated circuit 240 is independently disposed outside a flexible printed circuit board 220, but the invention is not limited thereto. In other embodiments, the touch control integrated circuit 240 may also be directly disposed on the flexible printed circuit board 220.

In the present exemplary embodiment, the electrostatic discharge protection circuit 230 includes two current-limiting elements (e.g., diodes D1 and D2) connected in series between a system voltage VDD and a grounding voltage GND. The electrostatic discharge protection circuit 230 is turned on when a potential difference between two ends (the diodes D1 and D2) is greater than a voltage threshold, so as to provide the electrostatic discharging path. In the present exemplary embodiment, the electrostatic discharge protection circuit 230 is disposed in the touch control integrated circuit 240. In another embodiment, the electrostatic discharge protection circuit 230 may also be disposed on the flexible printed circuit board 220, which is not particularly limited in the invention.

In addition, enough teaching, suggestion, and implementation illustration for disposing configurations, operation methods and effects of other circuitry blocks and elements in the embodiments of FIG. 4 to FIG. 6 can be obtained from the above embodiments in FIG. 1 to FIG. 3, thus related descriptions thereof are not repeated hereinafter.

FIG. 1 to FIG. 6 illustrate various different disposition patterns of touch electrodes on the touch panel and different implementations of the electrostatic discharge protection circuit. However, the electrostatic discharging method of the invention is not limited to be applicable only to the touch panel module as depicted in FIG. 1 to FIG. 6.

Figure 7:
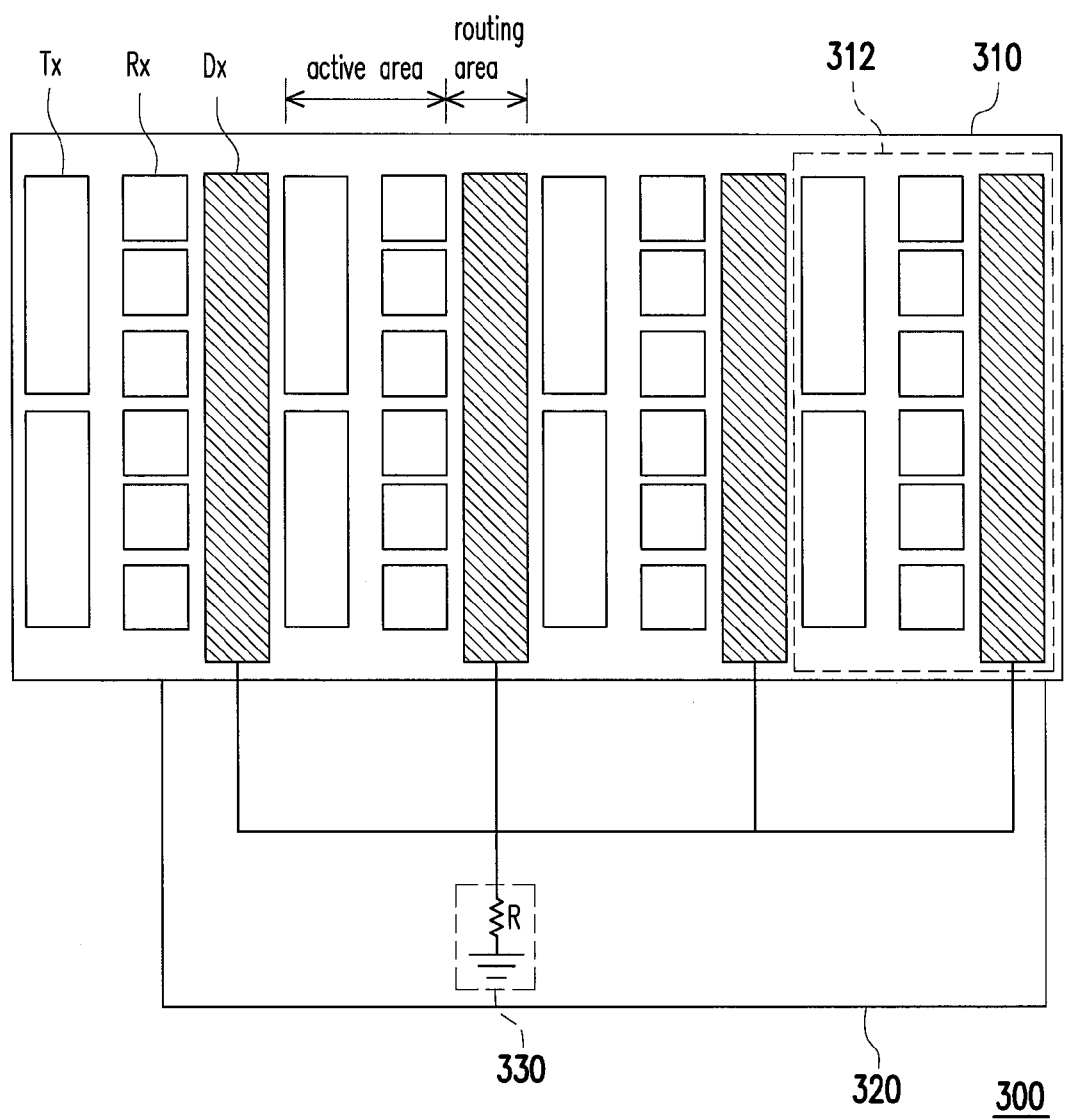
FIG. 7 is a schematic diagram illustrating a touch panel module according to another exemplary embodiment of the invention.

FIG. 7 is a schematic diagram illustrating a touch panel module according to another exemplary embodiment of the invention. Referring to FIG. 3 and FIG. 7, a touch panel module 300 of the present exemplary embodiment is similar to the touch panel module 100 of FIG. 3, and a major difference between the two is, for example, the disposition patterns of touch electrodes.

In the present exemplary embodiment, a touch panel 310 includes one or more driving electrodes Tx, one or more sensing electrodes Rx and one or more dummy electrodes Dx. The driving electrodes Tx and the sensing electrodes Rx are disposed in an active area of the touch panel 310. The dummy electrodes Dx are disposed in a routing area of the touch panel 310 and electrically connected to one another and electrically connected to an electrostatic discharge protection circuit 330. In other words, the dummy electrodes Dx in this example are at least configured to fill areas outside the driving electrodes Tx and the sensing electrodes Rx, so as to compensate the optical visibility. The electrostatic charges remained on the touch panel 310 may be discharged through a resistor R of the electrostatic discharge protection circuit 330, so as to improve the display quality of the display panel.

In the present exemplary embodiment, in a plurality of independent touch pads 312 of the touch panel 310, each of the driving electrodes Tx operates collaboratively with three sensing electrodes Rx to sense the touch gestures, and thereby forming an electrode disposition pattern of a 1T3R-type. It should be noted that, in the present exemplary embodiment, amounts and disposition relations of the driving electrodes Tx, the sensing electrodes Rx and the dummy electrodes Dx at each of the touch pads 312 are only illustrative, which are not particularly limited in the invention.

In addition, enough teaching, suggestion, and implementation illustration for disposing configurations, operation methods and effects of other circuitry blocks and elements in the embodiment of FIG. 7 can be obtained from the above embodiments in FIG. 1 to FIG. 6, thus related descriptions thereof are not repeated hereinafter.

FIG. 7 illustrates an exemplary embodiment using the electrode disposition pattern of the 1T3R-type on the touch panel together with the electrostatic discharge protection circuit implemented by the passive circuit. However, the electrostatic discharge protection circuit used together by the touch panel of the 1T3R-type according to the invention is not limited only to the implementation depicted in FIG. 7.

Figure 8:
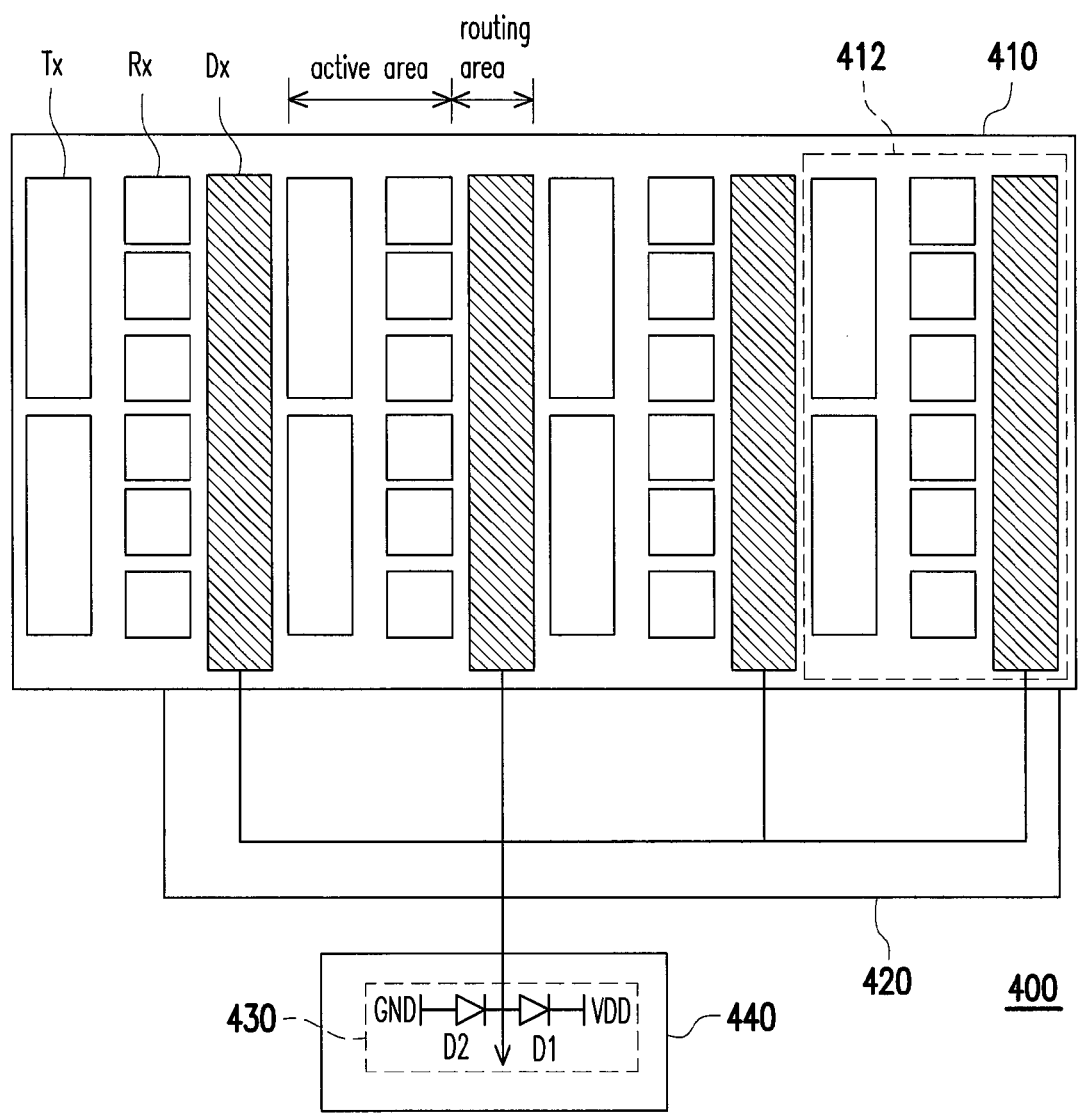
FIG. 8 is a schematic diagram illustrating a touch panel module according to another exemplary embodiment of the invention.

FIG. 8 is a schematic diagram illustrating a touch panel module according to another exemplary embodiment of the invention. Referring to FIG. 7 and FIG. 8, a touch panel module 400 of the present exemplary embodiment is similar to the touch panel module 300 of FIG. 7, and a major difference between the two is, for example, the implementations of the electrostatic discharge protection circuit.

In the present exemplary embodiment, the touch panel module 400 further includes the touch control integrated circuit 440, which is configured to control operations of the touch panel module 400. In this example, the touch control integrated circuit 440 is independently disposed outside a flexible printed circuit board 420, but the invention is not limited thereto. In other embodiments, the touch control integrated circuit 440 may also be directly disposed on the flexible printed circuit board 420. In the present exemplary embodiment, the electrostatic discharge protection circuit 430 includes two current-limiting elements (e.g., diodes D1 and D2) connected in series between a system voltage VDD and a grounding voltage GND. The electrostatic discharge protection circuit 430 is turned on when a potential difference between two ends (the diodes D1 and D2) is greater than a voltage threshold, so as to provide the electrostatic discharging path.

In addition, enough teaching, suggestion, and implementation illustration for disposing configurations, operation methods and effects of other circuitry blocks and elements in the embodiment of FIG. 8 can be obtained from the above embodiments in FIG. 1 to FIG. 7, thus related descriptions thereof are not repeated hereinafter.

In the exemplary embodiments of FIG. 1 to FIG. 8, the touch panels are described by using the single-layer multi-touch touch panel as an example. This single-layer multi-touch touch panel is, for example, an on-cell touch display module. However, the electrostatic discharging method of the invention is not limited to be applicable only to the single-layer multi-touch touch panels as depicted in FIG. 1 to FIG. 8.

Figures 9, 10:
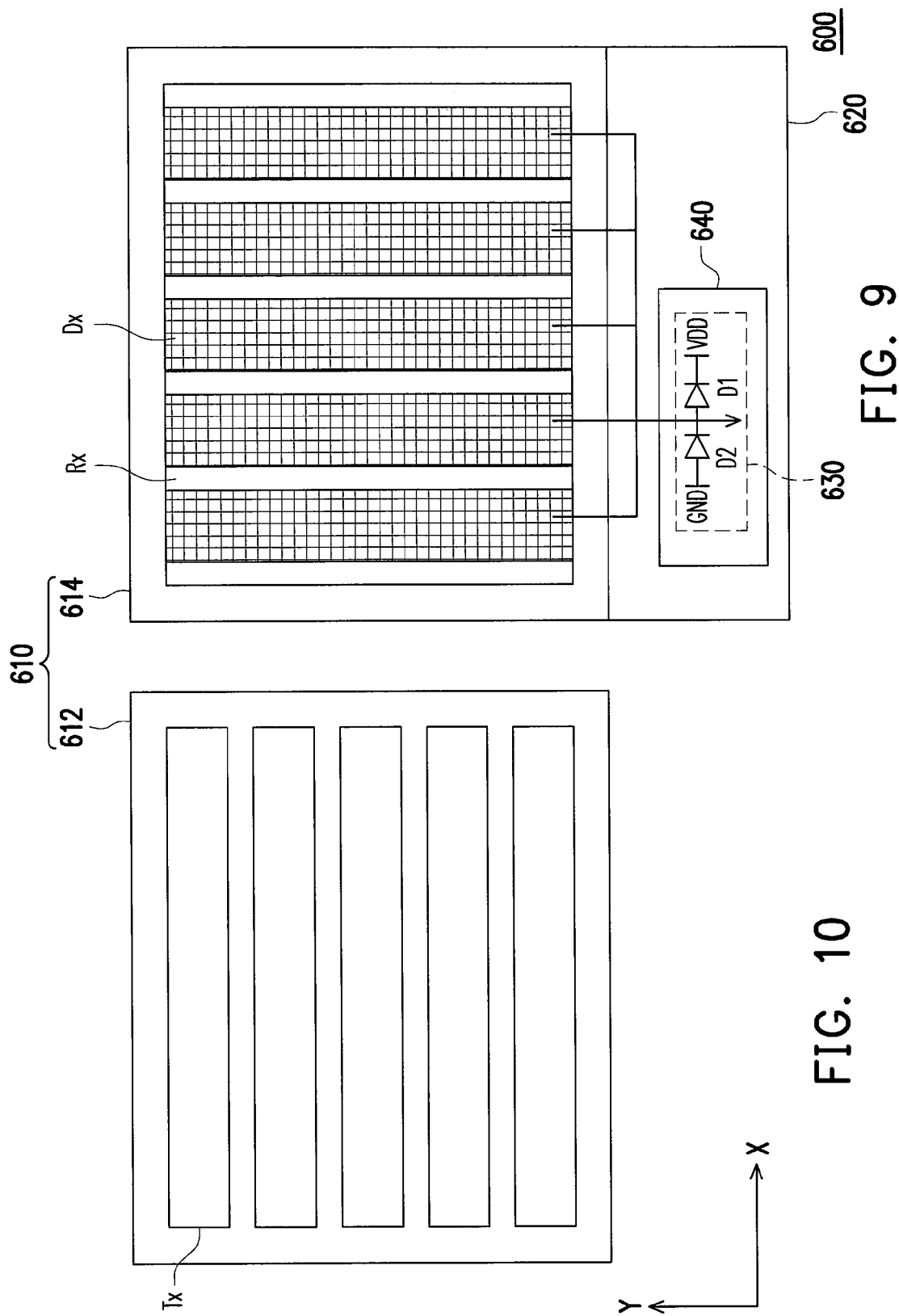
FIG. 9 and FIG. 10 are schematic diagrams illustrating a touch panel module according to another exemplary embodiment of the invention.

FIG. 9 and FIG. 10 are schematic diagrams illustrating a touch panel module according to another exemplary embodiment of the invention. Referring to FIG. 9 to FIG. 10, a touch panel 610 of the present exemplary embodiment is a double-layer touch panel. This double-layer touch panel is, for example, an in-cell touch display module. The touch panel 610 includes an upper substrate 612 and a lower substrate 614. The upper substrate 612 includes a plurality of driving electrodes Tx arranged along a first direction Y. The lower substrate 614 includes a plurality of sensing electrode Rx arranged along a second direction X. The driving electrodes Tx and the sensing electrodes Rx serve as conductive electrodes which are under control of a touch control integrated circuit 640 and configured to sense touch gestures on the touch panel 610. The first direction Y is substantially perpendicular to the second direction X. It should be noted that, in the present exemplary embodiment, amounts and arrangements of the driving electrodes Tx and the sensing electrodes Rx are only illustrative, which are not particularly limited in the invention.

In the present exemplary embodiment, the lower substrate 614 further includes one or more dummy electrodes Dx, which are configured to fill areas between the sensing electrodes Rx, so as to compensate the optical visibility. The dummy electrodes Dx are electrically connected to one another and electrically connected to an electrostatic discharge protection circuit 630. In the present exemplary embodiment, the electrostatic discharge protection circuit 630 includes two current-limiting elements (e.g., diodes D1 and D2) connected in series between a system voltage VDD and a grounding voltage GND. The electrostatic discharge protection circuit 630 is turned on when a potential difference between two ends (the diodes D1 and D2) is greater than a voltage threshold, so as to provide the electrostatic discharging path. In the present exemplary embodiment, the touch control integrated circuit 640 is disposed on a flexible printed circuit board 620, but the invention is not limited thereto. In other embodiments, the touch control integrated circuit 640 may also be independently disposed outside the flexible printed circuit board 620.

In addition, enough teaching, suggestion, and implementation illustration for disposing configurations, operation methods and effects of other circuitry blocks and elements in the embodiments of FIG. 9 and FIG. 10 can be obtained from the above embodiments in FIG. 1 to FIG. 8, thus related descriptions thereof are not repeated hereinafter.

Figures 11, 12:
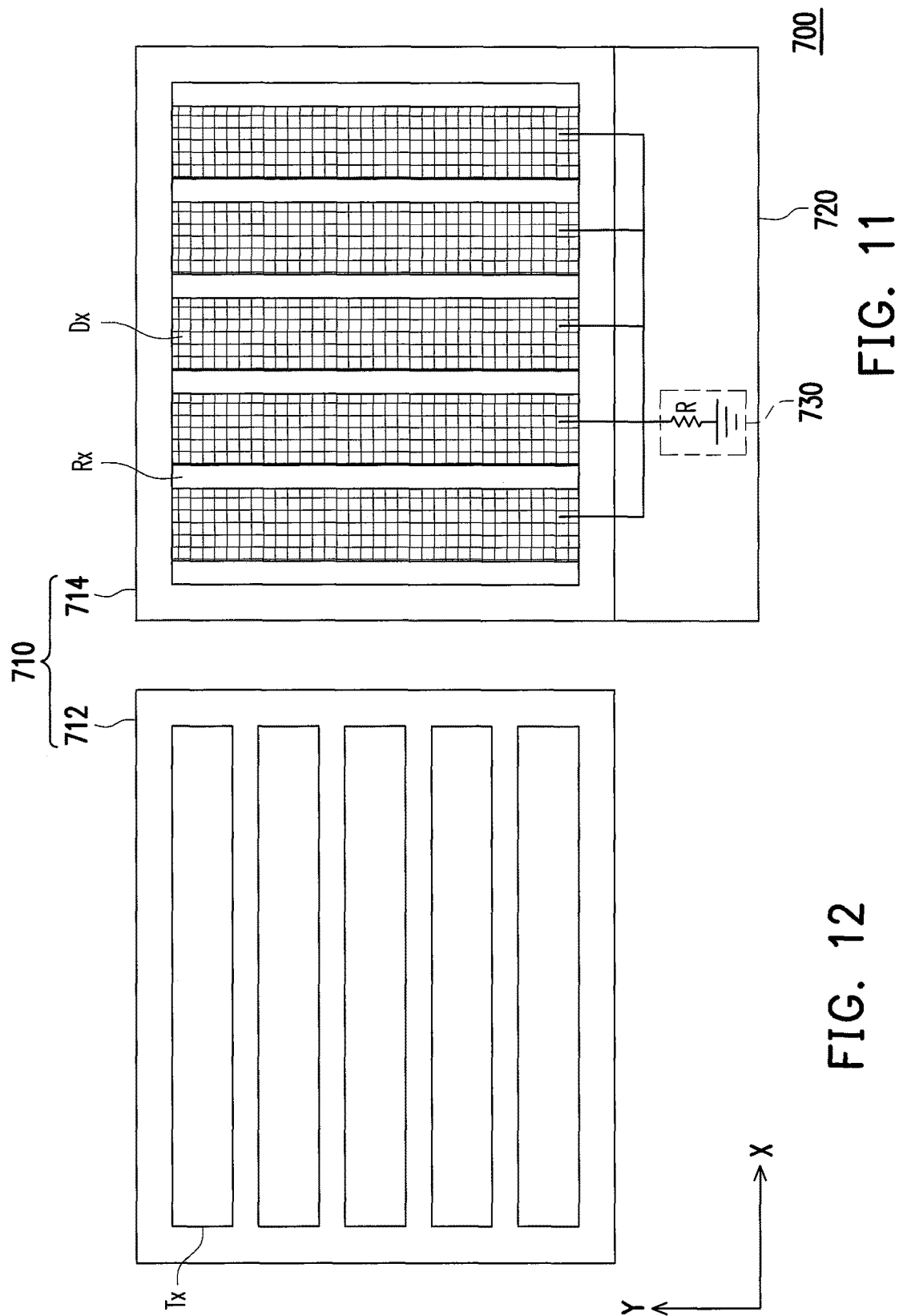
FIG. 11 and FIG. 12 are schematic diagrams illustrating a touch panel module according to another exemplary embodiment of the invention.

FIG. 11 and FIG. 12 are schematic diagrams illustrating a touch panel module according to another exemplary embodiment of the invention. Referring to FIG. 11 and FIG. 12, a touch panel module 700 of the present exemplary embodiment is similar to the touch panel module 600 of FIG. 9 and FIG. 10, and a major difference between the two is, for example, the implementations of the electrostatic discharge protection circuit. In the present exemplary embodiment, an electrostatic discharge protection circuit 730 includes, for example, a passive circuit. The passive circuit includes a resistor R, which is coupled between the dummy electrodes Dx and a reference voltage.

In this example, the reference voltage may be, for example, a grounding voltage that can be practically implemented by connecting the resistor R to the ground as shown in FIG. 11. Therefore, in the present exemplary embodiment, the dummy electrodes Dx are connected to the ground through the resistor R, so as to discharge the electrostatic charges remained on the display panel 710 in order to improve the display quality of the display panel. In another exemplary embodiment, the electrostatic discharge protection circuit 730 includes, for example, one or more wires electrically connected to the dummy electrodes Dx. In this example, the one or more wires are, for example, directly coupled to the ground to provide the electrostatic discharging path, and thus the resistor R is not disposed in such electrostatic discharging path.

In addition, enough teaching, suggestion, and implementation illustration for disposing configurations, operation methods and effects of other circuitry blocks and elements in the embodiments of FIG. 11 and FIG. 12 can be obtained from the above embodiments in FIG. 1 to FIG. 10, thus related descriptions thereof are not repeated hereinafter.

FIG. 13 and FIG. 14 are schematic diagrams illustrating a touch panel module according to another exemplary embodiment of the invention. Referring to FIG. 13 and FIG. 14, a touch panel module 800 of the present exemplary embodiment is similar to the touch panel module 600 of FIG. 9 and FIG. 10, and a major difference between the two is, for example, the implementations of the electrostatic discharge protection circuit.

In the present exemplary embodiment, an electrostatic discharge protection circuit 830 includes, for example, an active circuit. This active circuit includes at least one switch SW, which is coupled between the dummy electrodes Dx and a reference voltage. In this example, the reference voltage may be, for example, a grounding voltage that can be practically implemented by connecting the switch SW to the ground as shown in FIG. 13. In this example, the electrostatic discharge protection circuit 830 is disposed on a flexible printed circuit board 820, but the invention is not limited thereto. In other embodiments, the electrostatic discharge protection circuit 830 may also be independently disposed outside the flexible printed circuit board 820, or disposed inside a touch control integrated circuit (not illustrated).

In the present exemplary embodiment, the touch panel module 800 further includes a control circuit 850, which is configured to provide a control signal Vctrl to control a conducting state of the switch SW. In this example, the control circuit 850 is disposed on the flexible printed circuit board 820, but the invention is not limited thereto. In other embodiments, the control circuit 850 may also be independently disposed outside the flexible printed circuit board 820, or disposed inside the touch control integrated circuit (not illustrated). In addition, in an embodiment, the conducting state of the switch SW may also be controlled by directly using the touch control integrated circuit. In this case, it is not required to additionally dispose the control circuit 850 in the touch panel module 800.

Figure 15:
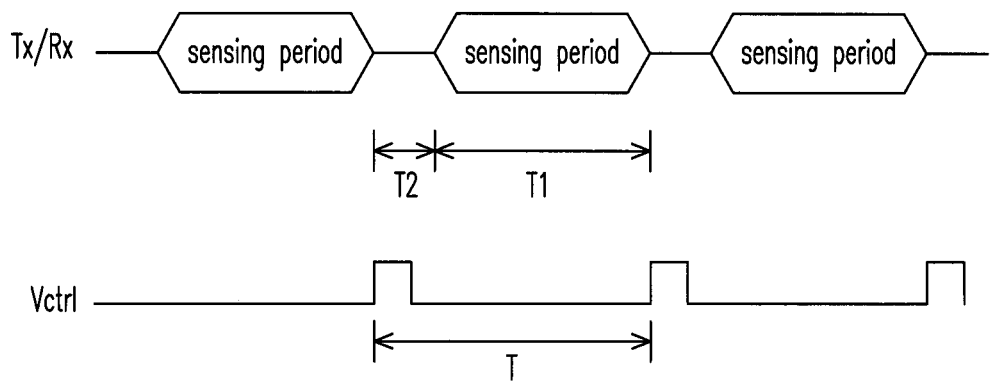
FIG. 15 is a schematic diagram illustrating signal waveforms of the touch panel module in the exemplary embodiment of FIG. 13 and FIG. 14.

In the present exemplary embodiment, the switch SW is intermittently turned on under control of the control signal Vctrl. During a period when the switch SW is turned on, the dummy electrodes Dx are connected to the ground through the switch SW, so as to discharge the electrostatic charges remained on the display panel 810 in order to improve the display quality of the display panel. Specifically, FIG. 15 is a schematic diagram illustrating signal waveforms of the touch panel module in the exemplary embodiment of FIG. 13 and FIG. 14. Referring to FIG. 13 to FIG. 15, an operation period T of the touch panel 810 may be divided into a sensing period T1 and a non-sensing period T2 based on whether the touch gestures are sensed by the touch panel 810. The switch SW is turned off during the sensing period T1, and is turned on within at least a part of time during the non-sensing period T2. In other words, the switch SW is turned on when the control signal Vctrl is in a high level period. Therefore, during the period when the switch SW is turned on (i.e., within at least the part of time during the non-sensing period of the touch panel), the switch SW can provide the electrostatic discharging path, so as to discharge the electrostatic charges remained on the display panel 810 in order to improve the display quality of the display panel.

In addition, enough teaching, suggestion, and implementation illustration for disposing configurations, operation methods and effects of other circuitry blocks and elements in the embodiments of FIG. 13 and FIG. 15 can be obtained from the above embodiments in FIG. 1 to FIG. 12, thus related descriptions thereof are not repeated hereinafter.

Figure 16:
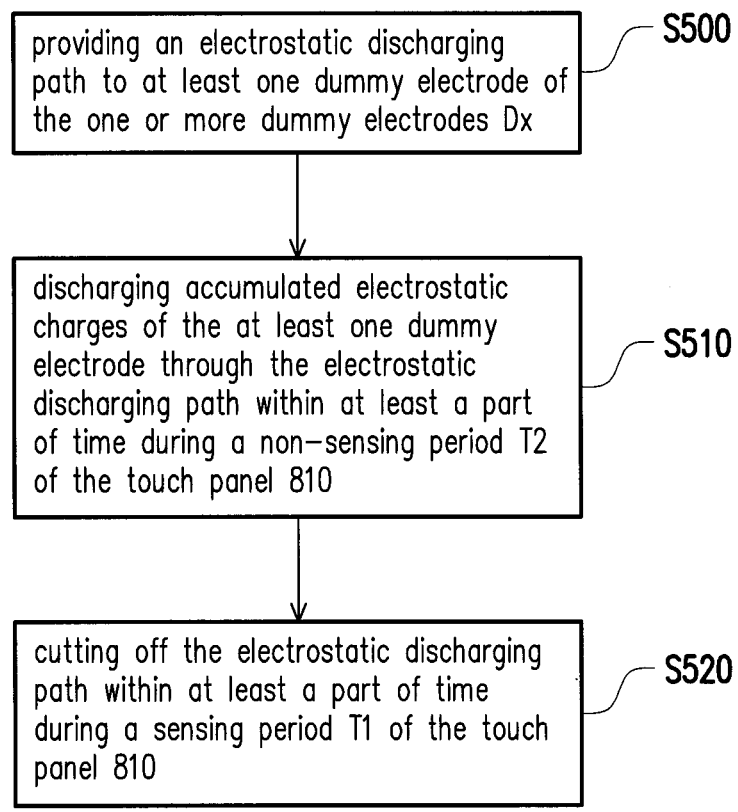
FIG. 16 is a flowchart illustrating steps of an electrostatic discharging method according to an embodiment of the present invention.

FIG. 16 is a flowchart illustrating steps of an electrostatic discharging method according to an embodiment of the present invention. Referring to FIG. 14 to FIG. 16, the electrostatic discharging method of the present exemplary embodiment is, for example, at least applicable to the touch panel module 800 of the exemplary embodiment of FIG. 13 and FIG. 14. The electrostatic discharging method of the present exemplary embodiment includes the following steps. In step S500, an electrostatic discharging path is provided by the electrostatic discharge protection circuit 830 to at least one dummy electrode of the one or more dummy electrodes Dx. In step S510, accumulated electrostatic charges of the at least one dummy electrode is discharged by the electrostatic discharge protection circuit 830 through the electrostatic discharging path within at least a part of time during a non-sensing period T2 of the touch panel 810. In step S520, the electrostatic discharging path is cut off by the electrostatic discharge protection circuit 830 within at least a part of time during a sensing period T1 of the touch panel 810. It should be noted that, an order of steps S510 and S520 may be properly adjusted according to a precedence of timings of the control signal Vctrl, which is not particularly limited in the invention.

In summary, according to the exemplary embodiments of the invention, the electrostatic discharge protection circuit of the touch panel module may be directly disposed on the flexible printed circuit board, independently disposed outside the flexible printed circuit board, or disposed inside the touch control integrated circuit. In addition, the implementations of the electrostatic discharge protection circuit include the active circuit or the passive circuit. The passive circuit is capable of directly providing the electrostatic discharging path to discharge the electrostatic charges, and the active circuit is capable of intermittently providing the electrostatic discharging path, so as to appropriately discharge the electrostatic charges of the touch panel module in order to improve the display quality of the display panel.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch panel module, comprising:
   a touch panel, comprising one or more conductive electrodes and one or more dummy electrodes, wherein the one or more conductive electrodes comprise at least one of one or more driving electrodes and one or more sensing electrodes, and the one or more dummy electrodes are configured to fill areas between the one or more conductive electrodes or areas outside the one or more conductive electrodes; and
   an electrostatic discharge protection circuit, electrically connected to at least one dummy electrode of the one or more dummy electrodes, and configured to provide an electrostatic discharging path to the at least one dummy electrode,
   wherein the electrostatic discharge protection circuit discharges accumulated electrostatic charges of the at least one dummy electrode through the electrostatic discharging path at all times, or
   the electrostatic discharge protection circuit discharges the accumulated electrostatic charges of the at least one dummy electrode through the electrostatic discharging path when a potential difference between two ends of the electrostatic discharge protection circuit is greater than a voltage threshold.

2. The touch panel module of claim 1, wherein
   the one or more conductive electrodes are disposed in an active area of the touch panel,
   the touch panel further comprises one or more routings disposed in a routing area of the touch panel and connected to the one or more conductive electrodes, and
   the one or more dummy electrodes are disposed in at least one of the routing area and the active area.

3. The touch panel module of claim 2, wherein the one or more dummy electrodes comprise one or ore first dummy electrodes and one or more second dummy electrodes, the one or more first dummy electrodes are disposed in the active area and electrically connected to one another, the one or more second dummy electrodes are disposed in the routing area and electrically connected to one another, and the one or more first dummy electrodes and the one or more second dummy electrodes are electrically connected to each other and electrically connected to the electrostatic discharge protection circuit.

4. The touch panel module of claim 3, wherein the touch panel is a single-layer multi-touch touch panel.

5. The touch panel module of claim 1, wherein the one or more conductive electrodes comprise the one or more sensing electrodes, the one or more dummy electrodes are configured to fill areas between the one or more sensing electrodes, and the one or more dummy electrodes are electrically connected to one another and electrically connected to the electrostatic discharge protection circuit.

6. The touch panel module of claim 5, wherein the touch panel is a double-layer touch panel.

7. The touch panel module of claim 1, wherein the electrostatic discharge protection circuit comprises a passive circuit.

8. The touch panel module of claim 7, wherein the passive circuit is coupled between the at least one dummy electrode and a reference voltage.

9. The touch panel module of claim 1, further comprising:
   a flexible printed circuit board, connected to the touch panel, wherein the electrostatic discharge protection circuit is disposed on the flexible printed circuit board.

10. The touch panel module of claim 1, further comprising:
    a touch control integrated circuit, configured to control operations of the touch panel module, wherein the electrostatic discharge protection circuit is disposed inside the touch control integrated circuit.

11. The touch panel module of claim 1, wherein the electrostatic discharge protection circuit is turned on when the potential difference between the two ends of the electrostatic discharge protection circuit is greater than the voltage threshold, so as to provide the electrostatic discharging path.

12. The touch panel module of claim 1, wherein the electrostatic discharge protection circuit comprises one or more wires electrically connected to at least one dummy electrode of the one or more dummy electrodes.

13. The touch panel module of claim 1, wherein the one or more dummy electrodes are electrically connected to one another, and further electrically connected to the electrostatic discharge protection circuit.

14. An electrostatic discharging method of a touch panel module, the touch panel module comprising a touch panel, and the touch panel comprising one or more conductive electrodes and one or more dummy electrodes, wherein the one or more conductive electrodes comprises at least one of one or more driving electrodes and one or more sensing electrodes, the one or more dummy electrodes are configured to fill areas between the one or more conductive electrodes or areas outside the one or more conductive electrodes, and the method comprises:

- providing an electrostatic discharging path to at least one dummy electrode of the one or more dummy electrodes; and
- discharging accumulated electrostatic charges of the at least one dummy electrode through the electrostatic discharging path at all times, or
- discharging the accumulated electrostatic charges of the at least one dummy electrode through the electrostatic discharging path when a potential difference between two ends of the electrostatic discharge protection circuit is greater than a voltage threshold.

* * * * *